US011605569B2

(12) United States Patent
Tuominen et al.

(10) Patent No.: US 11,605,569 B2
(45) Date of Patent: Mar. 14, 2023

(54) PACKAGED INTEGRATED CIRCUIT WITH INTERPOSING FUNCTIONALITY AND METHOD FOR MANUFACTURING SUCH A PACKAGED INTEGRATED CIRCUIT

(71) Applicant: AT&S Austria Technologie & Systemtechnik Aktiengesellschaft, Leoben (AT)

(72) Inventors: Mikael Tuominen, Pernio (FI); Christian Vockenberger, Leoben (AT)

(73) Assignee: AT&SAustria Technologie & Systemtechnik AG, Leoben (AT)

( * ) Notice: Subject to any disclaimer, the term of this patent is extended or adjusted under 35 U.S.C. 154(b) by 0 days.

(21) Appl. No.: 16/360,931

(22) Filed: Mar. 21, 2019

(65) Prior Publication Data

US 2019/0326188 A1 Oct. 24, 2019

(30) Foreign Application Priority Data

Apr. 19, 2018 (EP) .................................. 18168207

(51) Int. Cl.
*H01L 23/13* (2006.01)
*H01L 23/31* (2006.01)
(Continued)

(52) U.S. Cl.
CPC ........ *H01L 23/13* (2013.01); *H01L 21/32051* (2013.01); *H01L 21/56* (2013.01);
(Continued)

(58) Field of Classification Search
CPC ................. H05K 3/4697; H05K 3/4652–4658
(Continued)

(56) References Cited

U.S. PATENT DOCUMENTS 5,353,498 A * 10/1994 Fillion .................. H01L 23/293
257/E23.092
6,271,469 B1 * 8/2001 Ma .......................... H01L 21/56
174/521
(Continued)

FOREIGN PATENT DOCUMENTS

CN 1406455 A 3/2003
CN 101689539 A 3/2010
(Continued)

OTHER PUBLICATIONS

Machine translation, Chen, Chinese Pat. Pub. No. CN107910312A, translation date: Dec. 2, 2022, Espacenet, all pages. (Year: 2022).*
(Continued)

*Primary Examiner* — Victoria K. Hall
(74) *Attorney, Agent, or Firm* — Robert A. Blaha; Smith Tempel Blaha LLC

(57) ABSTRACT

A packaged integrated circuit includes a core structure with a cavity therein; a component accommodated in the cavity; an electrically insulating structure formed over the core structure and the component; a partially electrically insulating carrier structure formed below the core structure and the component; and an electrically conducting redistribution arrangement formed at least partially within the carrier structure. The redistribution arrangement includes conductor structures each having a first element extending through the carrier structure and electrically connecting a contact of the component and a second element below the carrier structure. A part of the second element is a contact pad for electrically connecting the redistribution arrangement with external circuitry. The carrier structure includes a polyimide layer and an adhesive layer. The adhesive layer is directly attached to an upper surface of the polyimide layer and to a lower
(Continued)

surface of the core structure and a lower surface of the component.

4 Claims, 2 Drawing Sheets

(51) Int. Cl.
    *H01L 23/498*         (2006.01)
    *H01L 23/14*          (2006.01)
    *H01L 23/00*          (2006.01)
    *H01L 21/56*          (2006.01)
    *H01L 21/3205*       (2006.01)
    *H01L 23/538*         (2006.01)
    *H05K 3/46*           (2006.01)
    *H05K 1/18*           (2006.01)
    *H01L 23/522*         (2006.01)
    *H01L 23/66*          (2006.01)

(52) U.S. Cl.
    CPC .......... *H01L 21/568* (2013.01); *H01L 23/145* (2013.01); *H01L 23/3121* (2013.01); *H01L 23/49827* (2013.01); *H01L 23/49894* (2013.01); *H01L 23/5226* (2013.01); *H01L 23/5383* (2013.01); *H01L 23/5386* (2013.01); *H01L 23/5389* (2013.01); *H01L 24/19* (2013.01); *H01L 24/32* (2013.01); *H01L 24/97* (2013.01); *H05K 1/186* (2013.01); *H05K 3/4602* (2013.01); *H05K 3/4655* (2013.01); *H05K 3/4697* (2013.01); *H01L 23/66* (2013.01); *H01L 2224/32225* (2013.01); *H01L 2224/80856* (2013.01); *H01L 2224/92144* (2013.01); *H01L 2224/96* (2013.01); *H01L 2224/97* (2013.01); *H01L 2924/14* (2013.01); *H01L 2924/142* (2013.01); *H01L 2924/1431* (2013.01); *H01L 2924/14335* (2013.01)

(58) Field of Classification Search
    USPC ........................................................ 257/680
    See application file for complete search history.

(56) References Cited

U.S. PATENT DOCUMENTS

| | | | |
|---|---|---|---|
| 6,475,877 B1 | 11/2002 | Saia et al. | |
| 6,586,276 B2* | 7/2003 | Towle ................. | H01L 23/5389 257/E23.019 |
| 6,586,836 B1* | 7/2003 | Ma ...................... | H01L 23/4334 257/686 |
| 6,602,739 B1* | 8/2003 | Rose ....................... | H01L 24/20 438/126 |
| 6,939,738 B2* | 9/2005 | Nakatani ............. | H01L 21/4857 438/108 |
| 7,370,411 B2* | 5/2008 | Yamano .............. | H01L 21/6835 29/832 |
| 7,545,047 B2* | 6/2009 | Bauer .................. | H01L 21/6835 257/686 |
| 7,572,681 B1* | 8/2009 | Huemoeller .......... | H01L 21/561 257/700 |
| 7,842,887 B2* | 11/2010 | Sakamoto ............ | H01L 24/18 174/260 |
| 7,852,634 B2* | 12/2010 | Sakamoto ............ | H01L 21/568 361/761 |
| 7,906,860 B2* | 3/2011 | Meyer ................... | H01L 21/561 257/723 |
| 8,114,708 B2* | 2/2012 | McConnelee .......... | H01L 24/19 438/109 |
| 8,291,584 B2* | 10/2012 | Tanaka ................ | H05K 1/188 29/841 |
| 8,324,020 B2* | 12/2012 | Eichelberger ........ | H05K 1/0206 438/106 |
| 8,354,304 B2* | 1/2013 | Chow .................... | H01L 21/561 257/774 |
| 8,367,470 B2* | 2/2013 | Pagaila ................. | H01L 21/568 438/108 |
| 8,399,977 B2* | 3/2013 | Kunimoto ............. | H01L 21/561 257/690 |
| 8,530,753 B2* | 9/2013 | Kunimoto ............ | H05K 3/4602 174/260 |
| 8,633,582 B2* | 1/2014 | Chang ................. | H01L 23/5389 257/690 |
| 9,293,401 B2* | 3/2016 | Yoon ................. | H01L 21/76804 |
| 9,299,661 B2* | 3/2016 | Kapusta ............... | H01L 21/561 |
| 9,502,391 B2* | 11/2016 | Kwon ..................... | H01L 24/82 |
| 9,842,798 B2* | 12/2017 | Marimuthu ............ | H01L 24/17 |
| 10,461,008 B2* | 10/2019 | Jeong ..................... | H01L 24/20 |
| 10,510,727 B2* | 12/2019 | Hsiao ................ | H01L 21/6835 |
| 11,058,007 B2* | 7/2021 | Gavagnin ............. | H05K 1/028 |
| 11,071,214 B2* | 7/2021 | Matsuura ............. | H05K 3/4652 |
| 2003/0015342 A1* | 1/2003 | Sakamoto ............... | H01L 24/18 174/250 |
| 2003/0215993 A1* | 11/2003 | Oshima ............... | H01L 21/6835 438/200 |
| 2004/0032022 A1* | 2/2004 | Ding ..................... | H01L 23/36 257/706 |
| 2004/0033673 A1* | 2/2004 | Cobbley ............... | H01L 23/3128 438/455 |
| 2005/0124148 A1* | 6/2005 | Tuominen .............. | H05K 1/185 438/618 |
| 2005/0253244 A1 | 11/2005 | Chang | |
| 2006/0091561 A1* | 5/2006 | Dangelmaier .......... | H01L 24/32 257/778 |
| 2006/0145328 A1* | 7/2006 | Hsu ........................ | H05K 1/185 257/690 |
| 2006/0158804 A1* | 7/2006 | Usui ....................... | H01L 25/50 361/58 |
| 2006/0191711 A1* | 8/2006 | Cho .................... | H01L 23/5389 174/260 |
| 2007/0096306 A1* | 5/2007 | Yamagata ............. | H01L 25/165 257/734 |
| 2007/0126122 A1* | 6/2007 | Bauer ..................... | H01L 24/19 257/774 |
| 2007/0227765 A1* | 10/2007 | Sakamoto ............... | H01L 24/19 174/260 |
| 2008/0029872 A1* | 2/2008 | Hsu ........................ | H01L 24/19 257/690 |
| 2008/0032447 A1* | 2/2008 | Lee ..................... | H01L 23/3128 438/106 |
| 2008/0135977 A1* | 6/2008 | Meyer ................... | H01L 23/645 257/531 |
| 2008/0169123 A1* | 7/2008 | Sakamoto ............ | H01L 23/5389 174/257 |
| 2009/0039496 A1* | 2/2009 | Beer ..................... | H01L 23/3128 257/693 |
| 2009/0166832 A1* | 7/2009 | Dunne ................. | H01L 23/5389 257/680 |
| 2009/0205202 A1* | 8/2009 | Tanaka .................. | H05K 1/188 29/834 |
| 2009/0215231 A1* | 8/2009 | Inoue ..................... | H01L 24/19 438/125 |
| 2009/0242107 A1* | 10/2009 | Sunohara .............. | H01L 21/568 156/232 |
| 2010/0013081 A1* | 1/2010 | Toh ........................ | H01L 24/96 257/692 |
| 2010/0224397 A1* | 9/2010 | Shimizu ................. | H01L 24/82 174/260 |
| 2010/0317154 A1* | 12/2010 | Jobetto ................. | H01L 25/105 257/E21.532 |
| 2011/0225816 A1* | 9/2011 | Chou ..................... | H05K 1/186 29/829 |
| 2011/0291293 A1* | 12/2011 | Tuominen ........... | H01L 23/5389 257/774 |
| 2012/0037411 A1* | 2/2012 | Hsu .................... | H01L 23/49822 174/260 |

(56) References Cited

U.S. PATENT DOCUMENTS

| | | | |
|---|---|---|---|
| 2013/0075936 A1* | 3/2013 | Lin | H01L 23/49816 257/777 |
| 2013/0256900 A1* | 10/2013 | McConnelee | H01L 21/561 257/774 |
| 2013/0284506 A1* | 10/2013 | Zanma | H05K 3/305 174/260 |
| 2014/0076617 A1* | 3/2014 | Chen | H01L 23/5389 336/200 |
| 2014/0268780 A1* | 9/2014 | Wang | F21S 4/22 362/249.06 |
| 2015/0187742 A1* | 7/2015 | Kwon | H01L 24/24 438/126 |
| 2015/0359103 A1* | 12/2015 | Sano | H05K 1/0298 361/761 |
| 2016/0081194 A1* | 3/2016 | Sato | H05K 3/4697 361/761 |
| 2016/0105967 A1* | 4/2016 | Choi | H05K 1/185 174/251 |
| 2016/0155702 A1* | 6/2016 | Chen | H01L 23/3135 257/774 |
| 2016/0183378 A1* | 6/2016 | Hwang | H01G 4/005 174/260 |
| 2016/0242293 A1* | 8/2016 | Mikado | H05K 3/4697 |
| 2016/0322295 A1* | 11/2016 | Kobayashi | H01L 23/49827 |
| 2016/0366766 A1* | 12/2016 | Yeh | H05K 1/0298 |
| 2017/0231098 A1* | 8/2017 | Zluc | H05K 1/18 |
| 2018/0092220 A1* | 3/2018 | Wiedenhofer | H05K 1/183 |
| 2018/0213634 A1* | 7/2018 | Tuominen | H01L 23/5389 |
| 2019/0116671 A1* | 4/2019 | Tay | H05K 1/188 |
| 2019/0254169 A1* | 8/2019 | Tay | H05K 1/186 |
| 2019/0304961 A1* | 10/2019 | Lim | H01L 24/82 |
| 2020/0111717 A1* | 4/2020 | Gmunder | H01L 21/561 |
| 2021/0112666 A1* | 4/2021 | Moitzi | H01L 24/20 |
| 2021/0168944 A1* | 6/2021 | Baftiri | H05K 3/32 |
| 2021/0185816 A1* | 6/2021 | Tuominen | H05K 1/0298 |
| 2021/0195749 A1* | 6/2021 | Salkovic | H01F 27/06 |

FOREIGN PATENT DOCUMENTS

| | | | | |
|---|---|---|---|---|
| CN | 101827494 A | | 9/2010 | |
| CN | 103367169 | | 10/2013 | |
| CN | 103681561 A | | 3/2014 | |
| CN | 104966677 A | | 10/2015 | |
| CN | 106304611 A | | 1/2017 | |
| CN | 107910312 A | * | 4/2018 | H01L 23/3121 |
| CN | 107910312 A | | 4/2018 | |
| EP | 2672789 A2 | * | 12/2013 | H05K 1/18 |
| EP | 3 273 467 A2 | | 1/2018 | |
| WO | WO 2006056643 A2 | | 6/2006 | |

OTHER PUBLICATIONS

First Office Action in Application 201910262237.X; pp. 1-8; dated Nov. 8, 2022; China National Intellectual Property Administration; No. 6, Xitucheng Lu, Jimenqiao Haidian District, Beijing City, 100088, China.

English translation of cover pages of First Office Action in Application 201910262237.X; pp. 1-8; dated Nov. 8, 2022 China National Intellectual Property Administration; No. 6, Xitucheng Lu, Jimenqiao Haidian District, Beijing City, 100088, China.

* cited by examiner

PACKAGED INTEGRATED CIRCUIT WITH INTERPOSING FUNCTIONALITY AND METHOD FOR MANUFACTURING SUCH A PACKAGED INTEGRATED CIRCUIT

CROSS-REFERENCE TO RELATED APPLICATION

This application claims the benefit of the filing date of European Patent Application No. 18 168 207.1 filed Apr. 19, 2018, which is incorporated herein by reference in its entirety.

TECHNICAL FIELD

The present invention relates to the technical field of electronic assemblies comprising (highly) integrated electronic devices. In particular, the present invention relates to a packaged integrated circuit and a method for manufacturing such a packaged integrated circuit.

TECHNOLOGICAL BACKGROUND

Integrated circuit components are put into packages in order to allow for an easy handling and reliable assembly of electronic circuits e.g. onto a component carrier such as a printed circuit board (PCB). A package for or of an integrated circuit further provides protection for the packaged component against e.g. mechanical and/or chemical impacts.

For many years, continuously improved semiconductor manufacturing procedures yielded a dramatic miniaturization of bare semiconductor chips. Miniaturized semiconductor chips typically comprise within a small area a plurality of contact structures (e.g. Schottky contacts) for electrically connecting the chip to external circuitry. The spatial density of such contact elements may be so high that it is not possible to directly contact such a chip to an external circuitry such as a socket or an arrangement of contact pads formed on a PCB.

In order to facilitate an electric contacting of an integrated circuit chip to external circuitry, a so-called interposer can be used. An interposer is an electrical interface spatially routing between one socket or from one connection to another. The purpose of an interposer is to spread a connection to a wider pitch or to reroute a connection to a different connection.

It is known to integrate an interposing functionality into an electronic package for an electronic chip. However, adding an interposing functionality into an electronic package makes electronic packaging more difficult because additional process steps have to be carried out and to be controlled in a reliable manner.

SUMMARY

There may be a need for providing an easy to realize and easy to control electronic packaging solution with interposing functionality.

This need may be met by the subject matter according to the independent claims. Advantageous embodiments of the present invention are described by the dependent claims.

According to a first aspect of the invention, there is provided a packaged integrated circuit. The provided packaged integrated circuit comprises (a) a core structure having a through passage cavity formed therein; (b) an integrated circuit component being accommodated within the cavity; (c) an at least partially electrically insulating cover structure formed over an upper surface of the core structure and (or respectively) over an upper surface of the component; (d) an electrically insulating carrier structure formed below a lower surface of the core structure and (or respectively) below a lower surface of the component; and (e) an electrically conducting redistribution arrangement formed at least partially within the carrier structure. The redistribution arrangement comprises at least two electrically conducting conductor structures each having a first conductor element extending (vertically) through the carrier structure and electrically contacting one (of at least two) contact elements of the component and a second conductor element being formed below the carrier structure, wherein at least a part of the second conductor element is configured for electrically contacting the redistribution arrangement with external circuitry, wherein a first spacing between the (at least two) contact elements is smaller than a second spacing between the (at least two) second conductor elements. Further, the carrier structure comprises at least a polyimide layer and an adhesive layer, wherein the adhesive layer is directly attached on the one hand to an upper surface of the polyimide layer and on the other hand to a lower surface of the core structure and (or respectively) to a lower surface of the component.

The described packaged integrated circuit is based on the idea that by using an adhesive layer, the lower surface of the integrated circuit component can be attached to the polyimide layer in an easy and reliable manner. In this respect, it is important to understand that in contrast to known packaging solutions the adhesive layer, which may be simply a sticky foil, is not used as a temporary carrier material or a temporary layer which during manufacturing of the package is used and later removed. In accordance with the invention the adhesive layer remains a layer within a stack of several electrically conducting and/or electrically insulating layers of the described (final product of the) packaged integrated circuit.

The used polyimide layer has the advantage that it is a dielectric material with a low dielectric constant. This is in particular of benefit when using the described packaged integrated circuit for High Frequency (HF) applications. Further, it is mentioned that polyimide is a flexible material such that the accommodated integrated circuit component can be embedded within the core structure and the described layers below and above the core structure in a (mechanically) smooth manner. Further, polyimide is a so-called photo imageable material, which means that it can be structured and processed by known photolithography procedures with a high spatial resolution. This means that a high-density redistribution arrangement can be formed within the described electrically insulating carrier structure comprising both the polyimide layer and the adhesive layer.

In the described packaged integrated circuit, the adhesive layer, supported by the polyimide layer, closes a bottom opening of the cavity within which the component is accommodated and embedded respectively. Hence, for electrically contacting contact elements or contact structures of the integrated circuit component, whose contact elements/structures (e.g. Schottky contacts) are formed at (the bottom surface of) the integrated circuit component, at least a part of the redistribution arrangement must penetrate not only the polyimide layer but also the adhesive layer in a vertical direction. In this respect, the vertical direction is given by an axis which is oriented perpendicular to the planes of the layers of the packaged integrated circuit.

The "at least a part of the second conductor element" may be used for directly or indirectly electrically connecting the redistribution arrangement with external circuitry: In this context, a part of the second conductor element or the complete second conductor element may serve as a contact pad e.g. for connecting the redistribution arrangement with a further integrated circuit component or any other electronic component, which may form at least a part of the mentioned external circuitry. In other words, according to preferred embodiments of the invention the "at least a part of the second conductor element" may be such a contact pad. Of course, the external circuitry may also comprise conductor paths formed on a component carrier or a printed circuit board. Further, the external circuitry may comprise a further redistribution arrangement which could be formed e.g. within or by means of further layers of the packaged integrated circuit.

It is mentioned that not only the polyimide layer and the adhesive layer are the only electrically insulating layers which are characterized by certain dielectric constant. Also the core structure and/or electrically insulating carrier structure may comprise at least one dielectric layer having a certain dielectric constant. Again, in particular for HF applications, insulating material with a low dielectric constant should be used.

The core structure may be realized with at least a part of a component carrier or a printed circuit board (PCB) which comprises cured (resin) materials which make a significant contribution to the mechanical stability of the packaged integrated circuit already when manufacturing the same, e.g. when the integrated circuit component is placed into the cavity. This means that the described core structure may comprise a stack of at least one (cured) electrically insulating layer and at least one electrically conductive layer. For example, the core structure may be a laminate of such electrically conductive and or electrically insulating layer(s), in particular formed by applying mechanical pressure, if desired supported by thermal energy.

Overview of Embodiments

In the context of this document, the term "printed circuit board" (PCB) may particularly denote a component carrier which is formed by laminating several electrically conductive layers or layer structures with at least one electrically insulating layer or layer structure, for instance by applying pressure, if desired accompanied by the supply of thermal energy. A PCB may be plate-shaped (i.e. planar), three-dimensionally curved (for instance when manufactured using 3D printing) or may have any other shape. As preferred materials for PCB technology, the electrically conductive layers are made of copper, whereas the electrically insulating layers may comprise resin and/or glass fibers, so-called prepreg or FR4 material. The various electrically conductive layers may be connected to one another in a desired way by forming through-holes through the laminate, for instance by laser drilling or mechanical drilling, and by filling them with electrically conductive material such as in particular copper, thereby forming vias as through-hole connections. Apart from one or more components which may be embedded, a PCB is usually configured for accommodating one or more components on one or both opposing surfaces of the plate-shaped PCB. They may be connected to the respective main surface by soldering. A dielectric part of a PCB may be composed of resin with reinforcing fibers such as glass fibers.

In this document, the term "layer" may denominate any layer structure. In this context, the layer may be a continuous layer, a patterned layer or a plurality of non-consecutive islands within a common plane.

Descriptively speaking, the described packaged integrated circuit provides a Die Fan-Out packaging which can be realized with (known) PCB materials and PCB procedures. This may provide the advantage that a Fan-Out redistribution can be realized by means of the described redistribution arrangement with well-known PCB materials and also well-known PCB manufacturing procedures. In other words, the described packaged integrated circuit includes an easy to build adapter between an external circuitry having comparatively large pitched contacts and the integrated circuit component being embedded within the core structure.

With the described packaged integrated circuit, a large panel and cost competitive solution for packaging an integrated circuit component with interposing functionality can be provided by utilizing embedded PCB technology.

According to an embodiment of the invention, the second conductor element is directly attached to the polyimide layer. This may provide the advantage that (the lower surface of) the polyimide layer provides a (mounting) surface for those structures of the redistribution arrangement, whose structures can be used as contact pads for contacting the packaged integrated circuit with external circuitry. Due to the above-mentioned photo imageable property of polyimide, such contact pads with predetermined spatial shapes and dimensions can be formed in a precise and reliable manner.

According to a further embodiment of the invention, the cover structure is a laminated cover structure.

A corresponding lamination may include at least one lamination sheet which can be applied or attached to the upper surface of the core structure or the upper surface of the embedded integrated circuit component, respectively, e.g. by applying mechanical pressure, if desired supported by thermal energy. Thereby, uncured soft resin materials may cure such that after a corresponding lamination process the cover structure is (mechanically) strong enough in order to provide sufficient mechanical protection for the embedded integrated circuit component. Using a lamination procedure for realizing the described cover structure may provide the advantage that an easy and well-approved process known from PCB manufacturing can be employed.

According to a further embodiment of the invention, the cover structure fills at least one side gap being present between a side surface of the component and a sidewall of the cavity. This may provide the advantage that the integrated circuit component can be embedded (within the core structure) in a mechanically reliable manner. Thereby, the amount of excess (resin) material which is not used for forming the cover structure portion located above the integrated circuit component or above the upper surface of the core structure should be chosen as a function of the size of the side gap. Just for the sake of clarity, it is pointed out that depending on the position at which the integrated circuit component is placed into the cavity being (typically slightly) larger than the body of the integrated circuit component there may be at least two and at most four such side gaps.

According to a further embodiment of the invention, the laminated cover structure is made from one single lamination sheet. This may provide the advantage that the formation of the dielectric cover structure can be realized with a lamination procedure, which may be realized in a simple manner, which may be carried out in a fast manner, and which may be easy to control.

The single lamination sheet may be a so-called prepreg sheet which comprises (inter alia) uncured resin or any other material which, when being subjected to an appropriate treatment, cures or transforms into a structure having an increased hardness.

In some embodiments, the single laminating sheet comprises an electrically insulating layer and at least one electrically conductive layer formed at and/or attached to a lower and/or upper surface of the electrically insulating layer. The electrically insulating layer may be a (reinforced) resin and the electrically conductive layer may be a continuous or structured layer, preferably made from copper. In this case, the single laminating sheet may be denominated a Resin Coated Copper (RCC) sheet.

According to a further embodiment of the invention, each conductor structure further has a third conductor element being formed between the adhesive layer and the component. Thereby, at least a part of the third conductor element is a further contact pad for electrically contacting (a contact structure of) the component with the redistribution arrangement.

The further contact pad may have a horizontal spatial extension which is significantly larger than the corresponding size of the corresponding contact structure of the integrated circuit component, whose contact structure may be e.g. a known Schottky contact. Thereby, a reliable electrical connection to and from the integrated circuit component can be realized.

According to a further embodiment of the invention, the first conductor element (of the redistribution arrangement) is a metallized via.

The via may be formed in a known manner e.g. by means of laser drilling or mechanical drilling. In particular when employing laser drilling, a high spatial density of vias can be formed which allows for reliably contacting highly integrated circuit components having a correspondingly high number of contact structures within a comparatively small surface region. Depending on the specific application, the metallization of the via(s) may be realized by means of a full metallization or by means of a sidewall metallization.

According to a further embodiment of the invention, the core structure comprises a cured first PCB material which comprises at least one of the group consisting of resin, in particular reinforced or non-reinforced resin, for instance epoxy resin or Bismaleimide-Triazine resin, FR-4, FR-5, cyanate ester, polyphenylene derivate, glass, prepreg material, polyimide, polyamide, liquid crystal polymer, epoxy-based Build-Up Film, polytetrafluoroethylene, a ceramic, and a metal oxide.

Reinforcing materials may be webs, fibers or spheres, for example made of glass (multilayer glass). Although prepreg or FR4 are usually preferred, other materials may be used as well. For high-frequency materials such as polytetrafluoroethylene, liquid crystal polymer and/or cyanate ester resins may be preferably implemented in the described packaged integrated circuit as an electrically insulating layer structure.

According to a further embodiment of the invention, the cover structure is made from a second PCB material which comprises at least one of the group consisting of a prepreg material, a resin, in particular resin sheet, a cyanate ester, a polyphenylene derivate, a liquid crystal polymer, and a resin-based Build-Up Film, in particular epoxy-based Build-Up Film.

It is mentioned that during manufacturing of the described packaged integrated circuit, the second PCB material may be in an uncured state. This may hold true or apply in particular during the beginning of a lamination process for realizing the cover structure with one or more (resin) layers. During the lamination process, which may include applying a mechanical pressure, in particular supported by thermal energy, uncured material may transform into cured material.

According to a further embodiment of the invention, the redistribution arrangement and—if applicable—at least one (further) electrically conducting layer comprise a material being selected as at least one of the group consisting of copper, aluminum, nickel, silver, gold, palladium, and tungsten, any of the mentioned materials being optionally coated with supra-conductive material such as graphene.

Although copper is usually preferred, other materials or coated versions thereof are possible as well, in particular coated with supra-conductive material such as graphene.

The at least one further layer may be a structured or a patterned layer which can be used, in a known manner, for circuit paths. The redistribution arrangement may cover a full main surface of integrated circuit component and/or a full main surface of the core structure.

It is mentioned that procedures and materials well known from PCB technology can be used and relied upon also for realizing the redistribution arrangement.

According to a further embodiment of the invention, the (integrated circuit) component is selected from a group consisting of an active electronic component, an (unhoused or bare) electronic chip, a storage device, a signal processing component, a power management component, an optoelectronic interface element, a voltage converter, a cryptographic component, a transmitter and/or receiver, an electromechanical transducer, a microprocessor, and a logic chip.

According to a further aspect of the invention, there is provided a method for manufacturing an integrated circuit package. The provided method comprises (a) providing the core structure having a through passage cavity formed therein; (b) placing the integrated circuit component within the cavity; (c) providing the at least partially electrically insulating carrier structure and the electrically conducting redistribution arrangement below the core structure or the component; and (d) forming the electrically insulating cover structure over the core structure and (or respectively) over the component.

The described method is based on the idea that by using an adhesive layer which not only forms a temporary layer during manufacturing the integrated circuit package but which forms a layer which is present in the final product the manufacturing of a package having an interposing functionality can be simplified.

According to an embodiment of the invention, the at least partially electrically insulating carrier structure is formed at a lower surface of the core structure before placing the component within the cavity such that, when placing the component within the cavity, the component is directly attached to the adhesive layer. This may provide the advantage that after inserting the integrated circuit component into the cavity, the component remains at its position due to a sticky effect of the adhesive layer. In particular, there is no or only an extremely reduced risk that during a formation of the cover structure, the integrated circuit component will unintentionally shift within the cavity.

According to an embodiment of the invention, (a) before placing the component within the cavity, a temporary carrier structure is formed at a lower surface of the core structure such that the component is directly attached to the temporary carrier structure when placing the component within the cavity, and (b) after forming the cover structure over the core structure and (or respectively) over the component the temporary carrier structure is removed from the core structure respectively the component and the carrier structure is formed below the core structure and (or respectively) the component.

According to an embodiment of the invention, after the carrier structure has been formed below the core structure and (or respectively) the component, the redistribution arrangement is formed at least partially within the carrier structure. This may provide the advantage that a formation of the redistribution arrangement is carried out at a process stage, wherein the integrated circuit component is already embedded in a spatially reliable manner. As a consequence, the risk of forming electric contacts between the integrated circuit component and the redistribution arrangement, which electric contacts are unstable or even not working at all, can be significantly reduced.

It has to be noted that embodiments of the invention have been described with reference to different subject matters. In particular, some embodiments have been described with reference to method type claims whereas other embodiments have been described with reference to apparatus type claims. However, a person skilled in the art will gather from the above and the following description that, unless other notified, in addition to any combination of features belonging to one type of subject matter also any combination between features relating to different subject matters, in particular between features of the method type claims and features of the apparatus type claims, is considered to be disclosed with this document.

The aspects defined above and further aspects of the present invention are apparent from the examples of embodiment to be described hereinafter and are explained with reference to the examples of embodiment. The invention will be described in more detail hereinafter with reference to examples of embodiment but to which the invention is not limited.

DETAILED DESCRIPTION OF ILLUSTRATED EMBODIMENTS

Figure 1A:
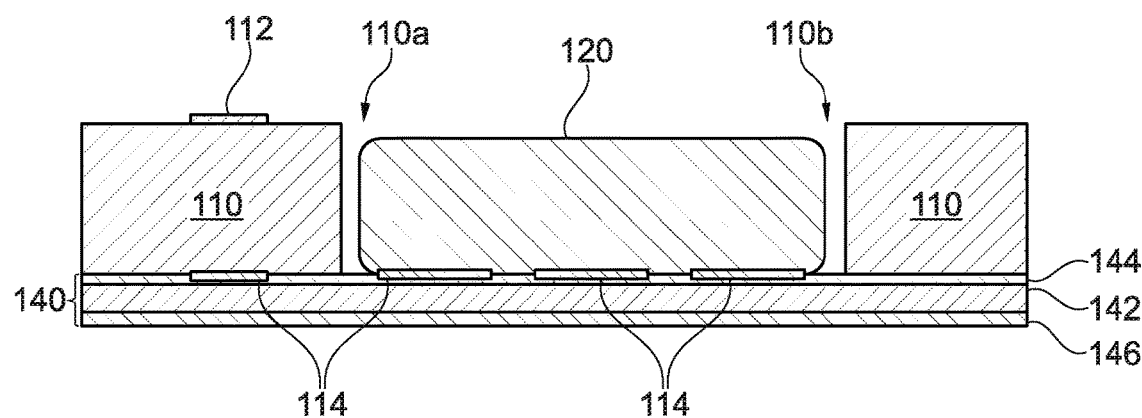
FIG. 1A, FIG. 1B and FIG. 1C illustrate a procedure for manufacturing a packaged integrated circuit, in which an embedded integrated circuit component is mounted to a polyimide layer with an adhesive layer being sandwiched between the polyimide layer and the component.

The illustrations in the drawings are schematically presented. It is noted that in different figures, similar or identical elements or features are provided with the same reference signs or with reference signs, which are different from the corresponding reference signs only within the first digit. In order to avoid unnecessary repetitions elements or features, which have already been elucidated with respect to a previously described embodiment, are not elucidated again at a later position of the description.

Further, spatially relative terms, such as "front" and "back", "above" and "below", "left" and "right", et cetera are used to describe an element's relationship to one or more other elements as illustrated in the figures. Thus, the spatially relative terms may apply to orientations in use which differ from the orientation depicted in the figures. Obviously, all such spatially relative terms refer to the orientation shown in the figures only for ease of description and are not necessarily limiting as an apparatus according to an embodiment of the invention can assume orientations different than those illustrated in the figures when in use.

Figure 1B:
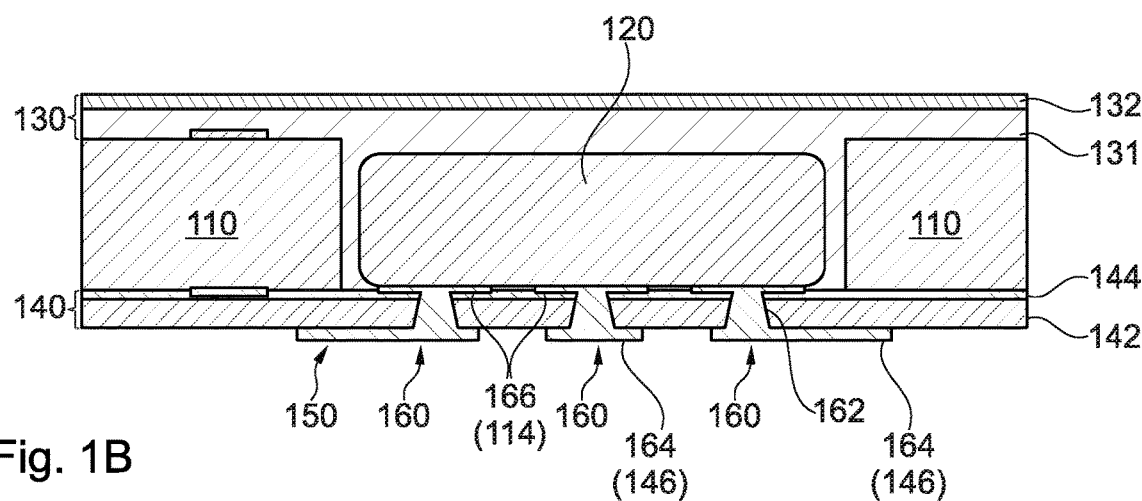
Figure 1C:
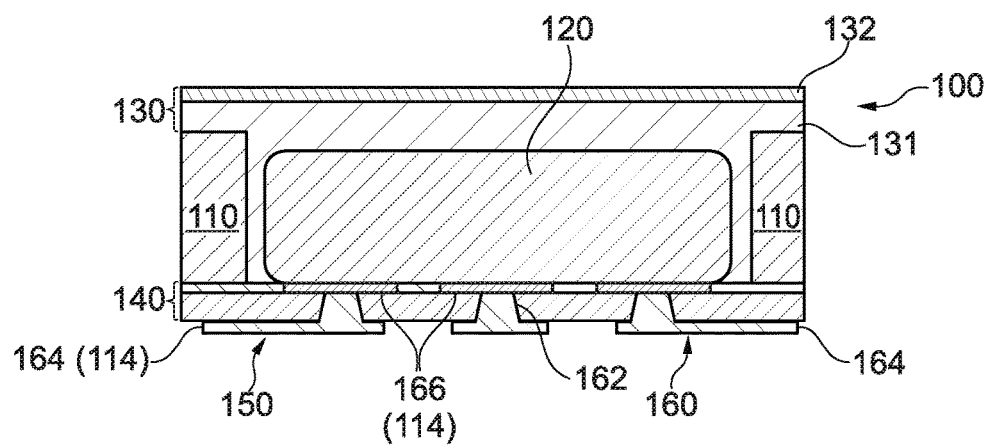

FIG. 1A to FIG. 1C illustrate a procedure for manufacturing a packaged integrated circuit 100 in accordance with an embodiment of the invention.

As can be taken from FIG. 1A showing an intermediate product, an integrated circuit component 120 has been placed within a cavity 110a which has been formed within the core structure 110. The core structure 110 comprises at least one cured PCB material as specified above. In between a body of the integrated circuit component 120 and a sidewall of the cavity 110a there is an unfilled side gap 110b. In FIG. 1A, two of such side gaps 110b can be seen.

According to the embodiment described here, there is provided an upper structured metal layer 112, which is formed on the top surface of the core structure 110. This upper structured metal layer 112 may be used in a known manner for forming conductor paths and/or contact pads for contacting the embedded component 120 with external and/or internal circuitry.

The bottom of the cavity 110a, which has been originally formed as the so-called through passage cavity is closed by a carrier structure 140. In between the carrier structure 140 and a bottom surface of the core structure 100 there is formed a lower structured metal layer 114, which may also be used for forming conductor paths and/or contact pads.

The carrier structure 140 comprises a stack of electrically conducting and electrically insulating layers. Specifically, according to the embodiment described here the carrier structure 140 comprises an adhesive layer 144 being located at the bottom surface of the core structure 110 and, within the region of the cavity 110a at the bottom surface of the component 120. Further, within the regions of the "pieces" of the lower structured metal layer 114 the adhesive layer 144 adheres to these "pieces". Below the adhesive layer 144 there is formed a polyimide layer 142. A stickiness of the adhesive layer 144 ensures that there is a reliable mechanical contact between the polyimide layer 142 and in particular the core structure 110 and (or respectively) the embedded integrated circuit component 120. Further, within the carrier structure 140 and below the polyimide layer 142 there is formed a metal layer 146, which according to the embodiment described here is copper layer 146.

FIG. 1B shows a further intermediate product which is formed when manufacturing the packaged integrated circuit 100. In this further intermediate product, a cover structure 130 has been laminated on top of the core structure 110 or the component 120, respectively. The cover structure 130 includes an electrically conductive layer 132 arranged at a surface of the electrically insulating layer 131. The cover structure 130 comprises a prepreg material layer, a resin sheet, or any as a suitable PCB material as specified above, wherein at least before a corresponding lamination procedure this PCB material is in an uncured state. As can be taken from FIG. 1B, after completing the lamination procedure the (PCB) material the cover structure 130 also fills the side gaps 110b, which improves the (mechanical) stability of the embedded integrated circuit component 120.

As can be further taken from FIG. 1B, a further processing has been carried out within or at the carrier structure 140. Specifically, the lower metal layer 146 has been structured such that contact pads 164 are formed. The contact pads 164 form part of an electric redistribution arrangement 150.

Within the context of this document, the contact pads 164 are denominated second conductor elements 164. Specifically, each one of the second conductor elements 164 forms a part of a conductor structure 160, which itself forms a part of a redistribution arrangement 150. Preferably, as can be taken from FIG. 1B, the number of conductor structures 160 (of the redistribution arrangement 150) corresponds to the number of non-depicted contact elements or contact structures of the integrated circuit component 120. The entirety of the conductor structures 160 is used for electrically connecting the component 120 with not depicted external circuitry.

Apart from the above mentioned second conductor element 164, each conductor structure 160 comprises a second conductor element 164 which corresponds to pieces of the lower structured metal layer 114. Further, each conductor structure 160 comprises one first conductor element 162, which is realized by means of a metallized via 162 and which electrically connects the respective second conductor element 164 with a corresponding further contact pad 166, which corresponds to one of the above mentioned "pieces" of the lower structured metal layer 114.

FIG. 1C shows the packaged integrated circuit 100 as the final product of the above described manufacturing procedure. The final packaged integrated circuit 100 is obtained by performing a known separating or singularizing procedure. Thereby, a superordinate PCB structure comprising a plurality of structures as depicted in FIG. 1B is subdivided or singularized into a plurality of individual packaged integrated circuits 100.

FIG. 2A to 2E illustrate in accordance with a further embodiment of the invention a manufacturing procedure for a packaged integrated circuit 200 also having an adhesive layer 144 being sandwiched between a polyimide layer 142 and an embedded component 120 or a core structure 110, respectively. It is mentioned that this embodiment is illustrated by way of example with an integrated circuit component 120, which, at least in the cross-sectional view shown in these Figures, only comprises two contact elements or contact structures.

Figure 2A:
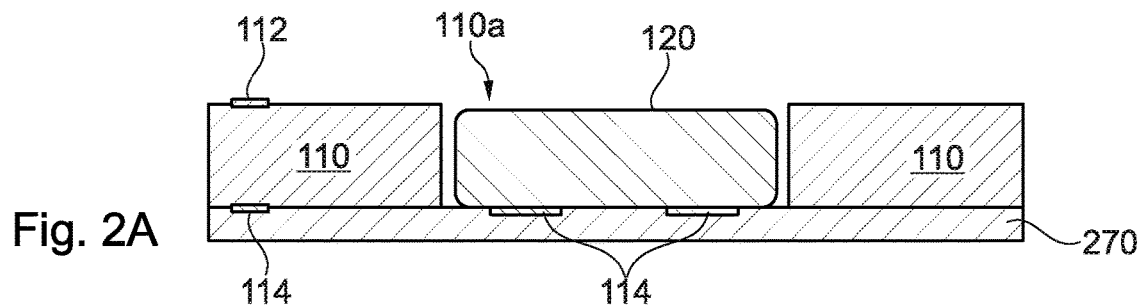
FIG. 2A, FIG. 2B, FIG. 2C, FIG. 2D and FIG. 2E illustrate a manufacturing procedure for producing a packaged integrated circuit also having an adhesive layer being sandwiched between a polyimide layer and an embedded component, wherein a temporary carrier structure is used.

As can be taken from a comparison between FIG. 1A elucidated above and FIG. 2A, a temporary carrier structure 270 is used instead of the carrier structure 140. Specifically, the temporary carrier structure 270 is used for closing the cavity 110a being originally a through passage cavity 110a at its bottom side. This means that when inserting the integrated circuit component 120 into the cavity 110a, the component 120 is placed onto the upper surface of the temporary carrier structure 270.

Figure 2B:
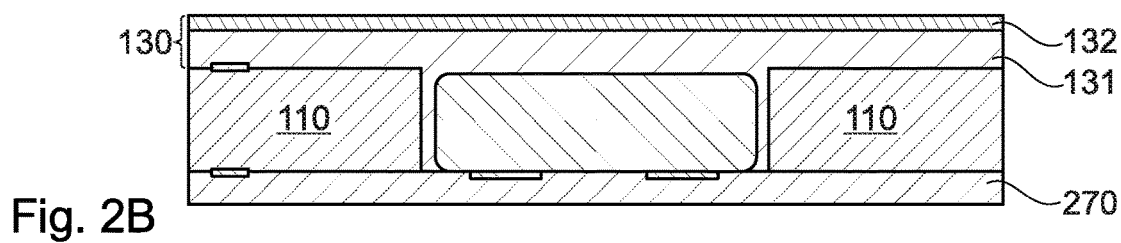

As can be taken from FIG. 2B, the cover structure 130 is laminated on top of the core structure 110 or the component 120. This procedure completely corresponds to the procedure illustrated in FIGS. 1A and 1B. Thus, as is further shown in FIGS. 2C-2E, the cover structure 130 includes the electrically conductive layer 132 arranged at the surface of the electrically insulating layer 131.

Figure 2C:
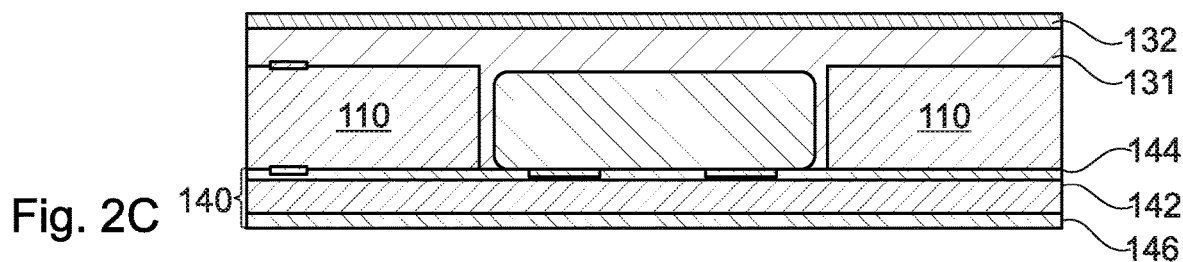

Next, as can be taken from FIG. 2C, the temporary carrier structure 270 is replaced by the carrier structure 140. The design of this carrier structure 140 has already been described above.

Figure 2D:
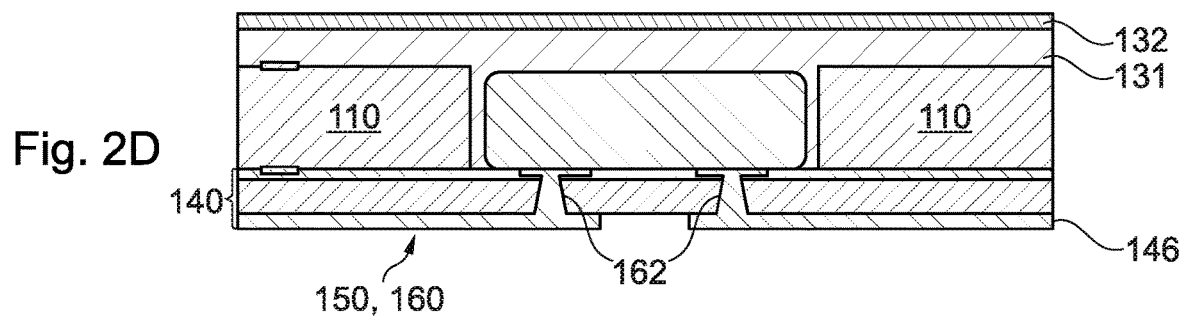
Figure 2E:
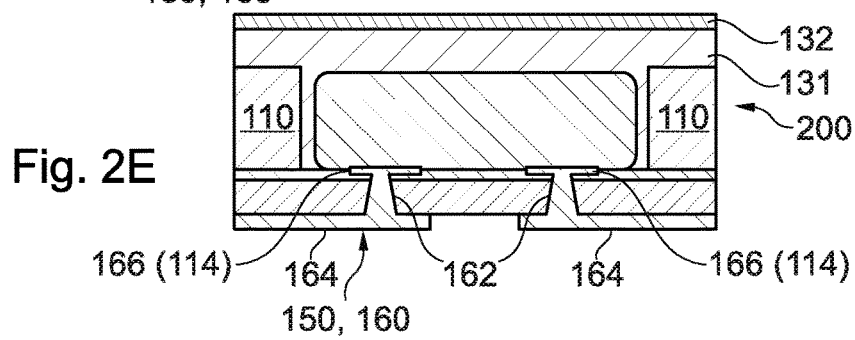

As can be taken from the FIGS. 2D and 2E, which correspond to the FIGS. 1B and 1C, respectively, for finalizing the packaged integrated circuit 200 an appropriate redistribution arrangement 150 is formed within the carrier structure 140 in order to provide an electric connection between the component 120 and external circuitry (not depicted). Further, a known separating or singularizing procedure is carried out in order to end up with the final packaged integrated circuit 200.

It should be noted that the term "comprising" does not exclude other elements or steps and the use of articles "a" or "an" does not exclude a plurality. Also, elements described in association with different embodiments may be combined.

LIST OF REFERENCE SIGNS 100 packaged integrated circuit
110 core structure
110a cavity
110b side gap
112 upper structured metal layer
114 lower structured metal layer
120 integrated circuit component
130 cover structure
140 carrier structure
142 polyimide layer
144 adhesive layer
146 metal layer/copper layer
150 redistribution arrangement
160 conductor structure
162 first conductor element/metallized via
164 second conductor element/contact pad
166 third conductor element/further contact pad
200 packaged integrated circuit
270 temporary carrier structure

The invention claimed is:

1. A method for manufacturing an integrated circuit package, the method comprising:
providing a core structure having a through passage cavity formed therein;
forming a temporary carrier structure at a lower surface of the core structure;
placing an integrated circuit component in the through passage cavity, the integrated circuit component comprising a lower structured metal layer protruding from a lower surface of the integrated circuit component, such that the lower surface of the integrated circuit component is directly attached to the temporary carrier structure and the lower structured metal layer of the integrated circuit component is embedded in the temporary carrier structure;
forming an at least partially electrically insulating cover structure over the core structure and the integrated circuit component,
after forming the cover structure over the core structure and the integrated circuit component, removing the temporary carrier structure from the core structure and the integrated circuit component, and
adhering a polyimide layer below the core structure, the through passage cavity and the integrated circuit component by means of an adhesive layer, wherein the polyimide layer and the adhesive layer form an at least partially electrically insulating carrier structure;
wherein, after the at least partially electrically insulating carrier structure has been formed, forming a redistribution arrangement at least partially within the at least partially electrically insulating carrier structure by a photolithography procedure with a high spatial resolution to structure the polyimide layer.

2. The method as set forth in claim 1, wherein providing the core structure comprises forming a structured metal layer along a first main surface of the core structure.

3. The method as set forth in claim 2, wherein providing the core structure comprises forming a structured metal layer along a second main surface of the core structure opposed to the first main surface.

4. The method as set forth in claim 1, wherein the redistribution arrangement comprises
- at least two conductor structures each having a first conductor element extending through the at least partially electrically insulating carrier structure and electrically contacting one contact element of at least two contact elements of the lower structured metal layer of the integrated circuit component; and
- a second conductor element being formed below the at least partially electrically insulating carrier structure,
- wherein at least a part of the second conductor element is configured for electrically contacting the redistribution arrangement with external circuitry,
- wherein a first spacing between the two contact elements of the lower structured metal layer of the integrated circuit component is smaller than a second spacing between the two second conductor elements.

* * * * *